(12) United States Patent
Chlipala et al.

(10) Patent No.: US 7,218,557 B1
(45) Date of Patent: May 15, 2007

(54) METHOD AND APPARATUS FOR ADAPTIVE DETERMINATION OF TIMING SIGNALS ON A HIGH SPEED PARALLEL BUS

(75) Inventors: James D. Chlipala, Emmaus, PA (US); Mohammad S. Mobin, Orefield, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/318,952

(22) Filed: Dec. 23, 2005

(51) Int. Cl.
*G11C 8/18* (2006.01)
(52) U.S. Cl. .................. 365/193; 365/189.07; 365/233
(58) Field of Classification Search .................. 365/193
See application file for complete search history.

(56) References Cited

U.S. PATENT DOCUMENTS 5,062,078 A * 10/1991 Arakawa ............... 365/189.07
6,889,334 B1 * 5/2005 Magro et al. ............... 713/500

* cited by examiner

Primary Examiner—Tan T. Nguyen

(57) ABSTRACT

Methods and apparatus are provided for adaptive determination of timing signals, such as on a high speed parallel bus. The invention adaptively determines a timing signal having a first edge with respect to an internal clock, wherein the timing signal includes a period in which the timing signal is undriven, followed by a period immediately before a first transition in which the timing signal is in a predefined state. The timing signal is evaluated using one or more comparators; and an output of the one or more comparators are latched based on a clock signal. The clock signal is adjusted until the one or more comparators indicate the timing signal is in the known and valid state. The clock signal is further adjusted until the one or more comparators indicate the first transition has been reached. Thereafter, a gating control signal is established based on a timing of the first transition.

25 Claims, 9 Drawing Sheets

METHOD AND APPARATUS FOR ADAPTIVE DETERMINATION OF TIMING SIGNALS ON A HIGH SPEED PARALLEL BUS

FIELD OF THE INVENTION

The present invention is related to techniques for increasing the performance and data throughput of ASIC devices, such as Synchronous Dynamic Random Access Memories (SDRAMs) and, more particularly, to techniques for adaptive determination of one or more timing signals associated with such ASIC devices.

BACKGROUND OF THE INVENTION

As the performance and data throughput requirements for networking and computing applications increase, the performance and data throughput requirements for many of the required individual subsystems also increase. Transferring data between the main memory and the system processor, for example, is often a significant performance bottleneck in any computing system. Even the fastest standard Dynamic Random Access Memory (DRAM) cannot keep up with the ever increasing bus speeds used on many computing systems.

Synchronous Dynamic RAM (SDRAM) is a type of DRAM that demonstrates improved performance and data throughput. While DRAM has an asynchronous interface (i.e., it immediately reacts to changes in its control inputs), SDRAM has a synchronous interface (i.e., it waits for a clock pulse before responding to its control inputs). Likewise, Double Data Rate (DDR) SDRAM is a further evolution of SDRAM that is used in many computing systems. As originally proposed, SDRAM acts on only the rising edge of the clock signal (i.e., each low-to-high transition). DDR SDRAM, on the other hand, acts on both the rising and falling edges, thereby potentially increasing the data rate by a factor of two. Further performance improvements are obtained in DDR-2 (2×) and QDR-2 (4×) by phase shifting the clock signal to obtain additional rising and falling edges.

SDRAM enjoys wide spread application in both low-end consumer computing applications, as well as in high end networking switches and routers. A DDR2 SDRAM interface protocol, for example, is used for communications between an integrated circuit (e.g., a memory controller) and an external memory. See, e.g., JEDEC Standard, DDR2 SDRAM Specification, JESD79-2A (January 2004), incorporated by reference herein. A parallel bus between the memory controller and the external memory typically carries parallel data that is being read from or written to the external memory. In addition, the memory controller provides a system clock CK to the external memory. In this manner, synchronization among the various signals on the parallel bus can be accomplished, for example, by a phase locked loop that generates the system clock CK. According to the DDR2 SDRAM Specification, the external memory will transmit a number of n+1 bit words DQ[0:n] and a data strobe signal, DQS, back to the controller in response to a read request, RD, from the controller.

The DQS signal and the data bits DQ[0:n] are ideally edge aligned. While the DQS signal is inactive, it is held in an undriven, high impedance (HI-Z) state. The controller should not utilize the DQS signal while it is in the HI-Z state, which would cause unpredictable results in the controller. Therefore, the DQS signal must be gated (e.g., AND or NAND gated) into the controller at the appropriate time (i.e., the time at which it is "safe" for the controller to use the DQS signal as an input). Read preamble and read postamble symbols bracket in time the usable portion of the DQS signal, in a known manner.

A number of techniques have been proposed or suggested for the controller to determine when to process the DQS signal during a read operation. Most techniques, especially for high data rates, rely on a priori design understandings to incorporate critical timing into the controller in a "hardwired" fashion. It has been found, however, that hard-wiring a single timing relationship into the DDR2 controller reduces the noise margin. In addition, this hard-wired approach also results in the rejection of some system configurations as impossible to meet timing. Further, aging effects could result in erroneous operation of the controller. A need therefore exists for methods and apparatus for adaptive determination of one or more timing signals, such as DDR2 DQS timing, in such ASIC devices.

SUMMARY OF THE INVENTION

Generally, methods and apparatus are provided for adaptive determination of timing signals, such as on a high speed parallel bus. According to one aspect of the invention, a method is provided for adaptive determination of a timing signal having a first edge with respect to an internal clock, wherein the timing signal includes a period in which the timing signal is undriven, followed by a period immediately before a first transition in which the timing signal is in a predefined state. The timing signal is evaluated using one or more comparators; and an output of the one or more comparators are latched based on a clock signal. The clock signal is adjusted until the one or more comparators indicate the timing signal is in the predefined state. The clock signal is further adjusted until the one or more comparators indicate the first transition has been reached. Thereafter, a gating control signal is established based on a timing of the first transition.

The timing signal can be received, for example, from a memory in response to a read request. The comparators can compare the timing signal to one or more controllable voltage levels. The period in which the timing signal is undriven can be, for example, a high-impedance state. The timing signal may be a data strobe signal. The period when the signal has a predefined state can be a preamble period or a postamble period.

A more complete understanding of the present invention, as well as further features and advantages of the present invention, will be obtained by reference to the following detailed description and drawings.

BRIEF DESCRIPTION OF THE DRAWINGS

FIGS. 6 through 11 illustrate the calibration of the control inputs VCMPLO, VCMPCM, and VCMPHI of the three comparators CMPL, CMPM, CMPH of FIG. 5 for various exemplary placements of the L-CLK signal during the calibration routine by the controller of FIG. 5;

DETAILED DESCRIPTION

The present invention provides methods and apparatus for adaptive determination of one or more timing signals, such as DDR2 DQS timing. While the present invention is illustrated in the context of a DQS signal in a DDR2 SDRAM, the present invention can be applied for the adaptive determination of any timing signal where the timing of a first edge with respect to an internal clock must be determined; and the signal has a period in which it is undriven, i.e., has a high-Z state; has a period immediately before the first transition in which the signal is in a known and valid state (i.e., 0 or 1); and has a particular timing relationship established with other signal inputs to the controller and which timing relationship must be altered.

Figure 1:
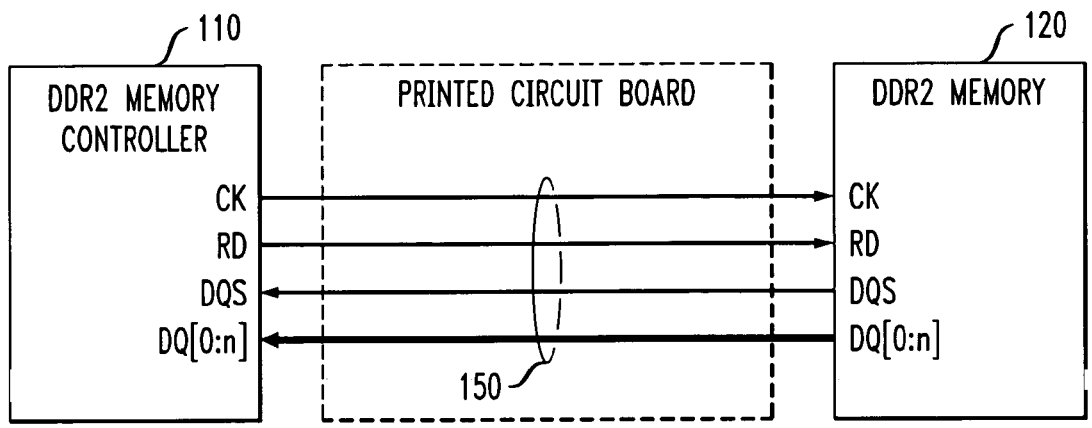
FIG. 1 illustrates a DDR2 SDRAM interface protocol used for communications between an integrated circuit and an external memory.
Figure 2:
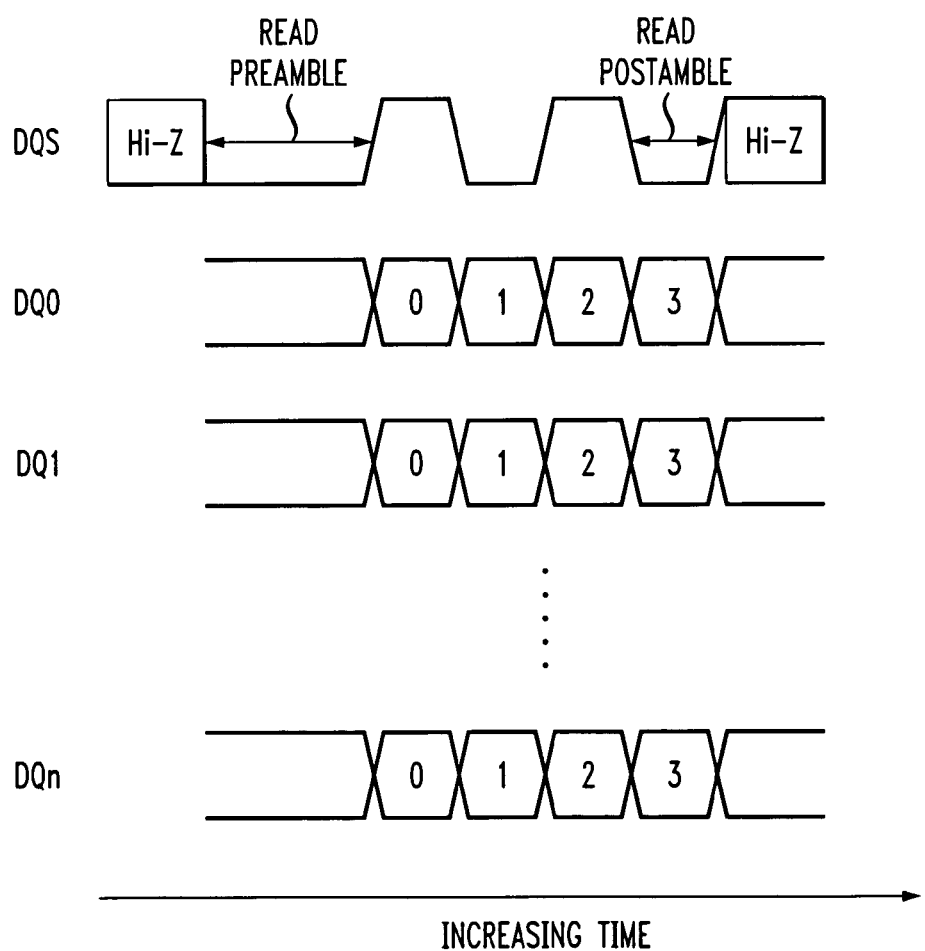
FIG. 2 illustrates the parallel data signals, DQn, and the data strobe signal DQS, of FIG. 1 in further detail.

In order to aid understanding of an improved memory controller in accordance with the present invention, the operation of a memory controller is discussed in conjunction with FIGS. 1 and 2. FIG. 1 illustrates a DDR2 SDRAM interface protocol used for communications between an integrated circuit 110 (e.g., a memory controller) and an external memory 120. See, e.g., JEDEC Standard, DDR2 SDRAM Specification, JESD79-2A (January 2004), incorporated by reference herein. As shown in FIG. 1, a parallel bus 150 between the memory controller 110 and the external memory 120 carries parallel data that is being read from or written to the external memory. In addition, the memory controller 110 provides a system clock CK to the external memory 120. In this manner, synchronization among the various signals on the parallel bus 150 can be accomplished, for example, by a phase locked loop that generates the system clock CK. According to the DDR2 SDRAM Specification, the external memory 120 will transmit a number of n+1 bit words DQ[0:n] and a data strobe signal, DQS, back to the controller 110 in response to a read request, RD, from the controller 110.

FIG. 2 illustrates the parallel data signals, DQn, and the data strobe signal DQS, of FIG. 1 in further detail. As shown in FIG. 2, the DQS signal and the data bits DQ[0:n] are ideally edge aligned. While the DQS signal is inactive, it is held in an undriven, high impedance (HI-Z) state. The controller 110 should not utilize the DQS signal while it is in the HI-Z state, which would cause unpredictable results in the controller 110. Therefore, the DQS signal must be gated (e.g., AND or NAND gated) into the controller 110 at the appropriate time (i.e., the time at which it is "safe" for the controller 110 to use the DQS signal as an input). FIG. 2 also illustrates the read preamble and read postamble symbols that together bracket in time the usable portion of the DQS signal, in a known manner.

Figure 3:
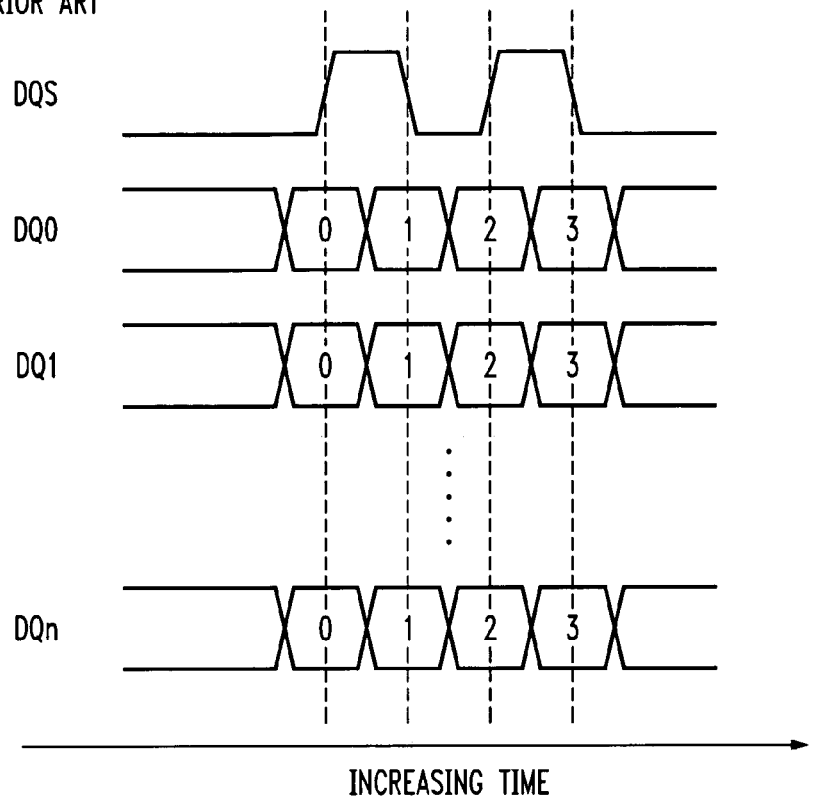
FIG. 3 illustrates a timing relationship of the DQS signal and DQ[0:n] data bits on the parallel bus inside the memory controller of FIG. 1 after the DQS signal has been delayed and the HI-Z states have been removed by the gating function.

As previously indicated, the DQS signal and the data bits DQ[0:n] are ideally edge aligned. Further, the controller 110 must determine when to process the DQS signal during a read operation. The controller 110 must then delay the DQS signal by an appropriate amount so that it may be used as a strobe to clock the data into the controller. FIG. 3 illustrates a timing relationship of the DQS signal and DQ[0:n] data bits in the memory controller 110 after the DQS signal has been delayed and the HI-Z states have been removed by the gating function (e.g., AND or NAND gates).

Figure 4:
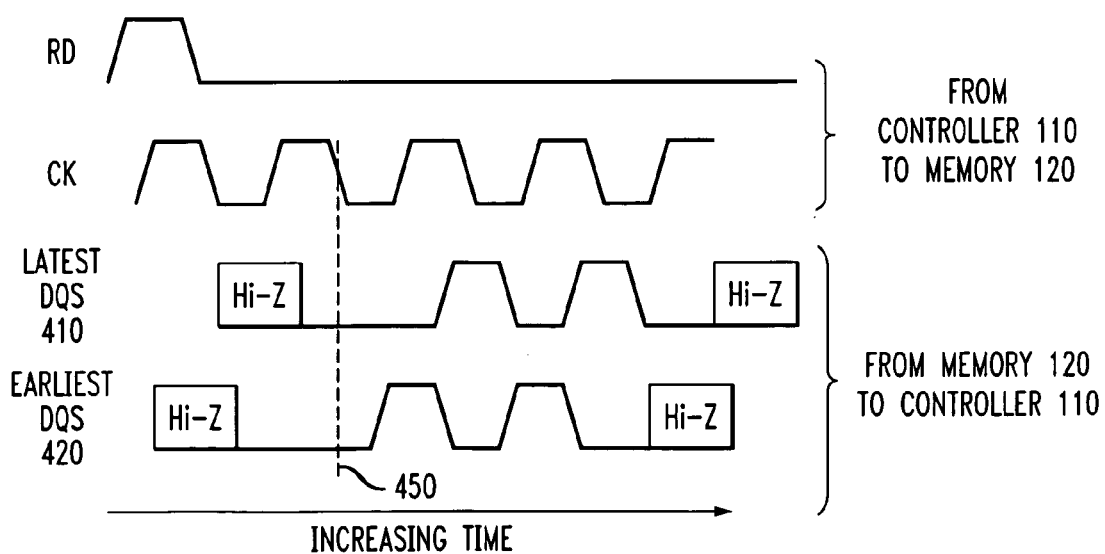
FIG. 4 illustrates a read command RD and the system clock CK as they originate in the controller for transmission to the external memory and the latest and earliest arrival of the DQS signal returned from the memory to the memory controller.

An important design challenge is the specification, at an appropriate time, of the signal that enables the gating of the DQS signal into the controller circuitry. FIG. 4 illustrates a read command RD and the system clock CK as they originate in the controller 110 for transmission to the external memory 120. As shown in FIG. 4, a rising edge of CK strobes the read line and transmits a read pulse to the memory. FIG. 4 also demonstrates two extremes 410, 420 in the arrival time of the DQS signal at the controller 110 from the memory 120. The variation in arrival times from one system to another can be caused by, for example, memory controller integrated circuit (IC) process and temperature variation, memory process and temperature variation, and printed circuit board variation (e.g., in components, board signal path lengths, and board material properties).

Typically, a CK edge after the rising edge that strobes the RD pulse is selected as the timing instance 450 to gate the DQS signal. This CK edge must not occur during the Hi-Z portion or after the leading edge of the first data, i.e., it must occur during the preamble. Further, this CK edge must occur during the preamble of all possible arriving DQS signals. FIG. 4 demonstrates that, for this exemplary system, selection of the second falling CK edge after the rising CK edge which strobes the RD pulse would be acceptable as the timing instance 450 to gate the DQS signal. Situations may arise in which it is difficult or even impossible to identify the same CK edge for this gate enable function that is appropriate over all variations (arrival times). As previously indicated, this identification is typically "hard-wired" into the controller 110 for conventional techniques.

Generally, the present invention provides an interface that for all ranges of conditions allows an appropriate clock edge to be selected by the controller 110 as the timing instance 450 to gate the DQS signal. The disclosed DDR2 controller techniques address the following four known challenges:

1. protection of the controller circuitry from the Hi-Z states of the DQS signal;
2. delay of the DQS signal by an appropriate amount (such as ¼ system clock period);
3. establishment of timing over controller, board, and memory PVT variations; and
4. aging effects.

Improved DDR2 Controller with Delay Line

Figure 5:
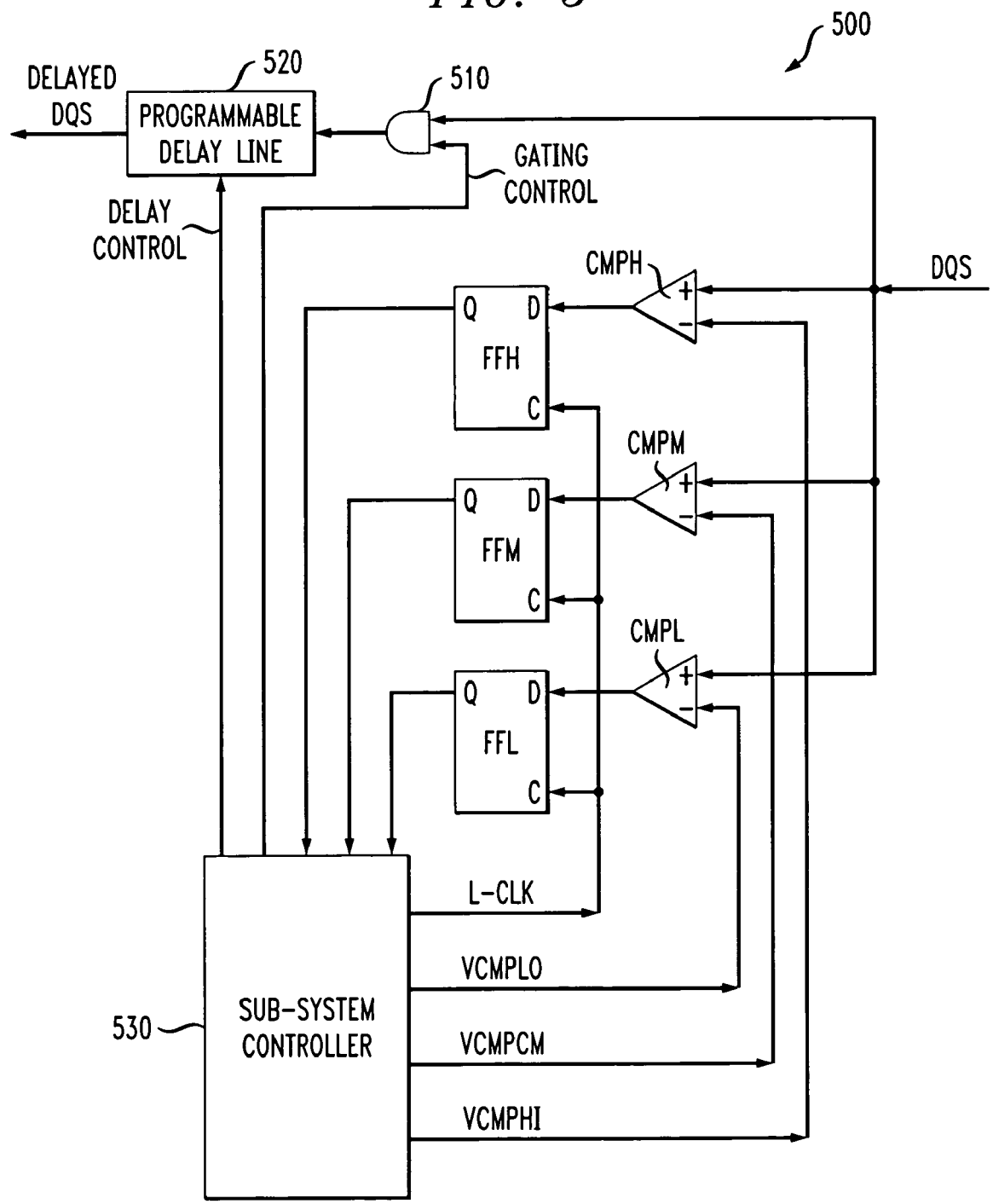
FIG. 5 is a schematic block diagram of an improved DDR2 controller incorporating features of the present invention.

FIG. 5 is a schematic block diagram of an improved DDR2 controller 500 incorporating features of the present invention. As shown in FIG. 5, the DQS signal received from the memory 120 in response to a read-from-memory request is distributed to a number of exemplary comparators CMPL, CMPM, CMPH and, through a gating circuit 510, such as an AND gate, to a programmable delay line 520. The voltage levels against which DQS is compared are provided by three control signals VCMPLO, VCMPCM, VCMPHI. These three signals are provided by a subsystem controller 530. The subsystem controller 530 can set these three control signals VCMPLO, VCMPCM, VCMPHI to a range of voltage levels. The comparator outputs would be binary if both + and − inputs were valid. For instance, the comparator output would be "1" if the "+" input were greater than the "−" input and "0" otherwise. The comparators will behave in a particular manner when experiencing Hi-Z inputs as described below.

The digital outputs of the comparators CMPL, CMPM, CMPH are latched by three flip-flops FFL, FFM, FFH. The time at which these flip-flops FFL, FFM, FFH latch the outputs of the comparators CMPL, CMPM, CMPH is determined by a clock, L-CLK, provided by the subsystem controller 530. The subsystem controller 530 can adjust the time of the L-CLK edges within a certain range. A delayed version of DQS is created by the programmable delay line 520. The delay value of the programmable delay line 520 is provided by the subsystem controller 530. The gating circuit 510 is controlled by a gating control signal provided by the subsystem controller 530. The determination of the timing of this gating control signal is described further below. Generally, for correct operation, the gating control signal must occur after the Hi-Z state and before the first edge of DQS, i.e. during the preamble.

According to one aspect of the invention, a calibration routine is performed to determine the delay between the system clock edge that strobes the RD signal and the arrival at the controller of both the end of the Hi-Z state and the first valid DQS edge. During the calibration routine, the controller 110 will issue a sequence of read-from-memory requests. The data DQ[0:n] produced by the memory 120 during this activity are irrelevant. The DQS signals will be scrutinized to find the delays mentioned above.

Figure 6:
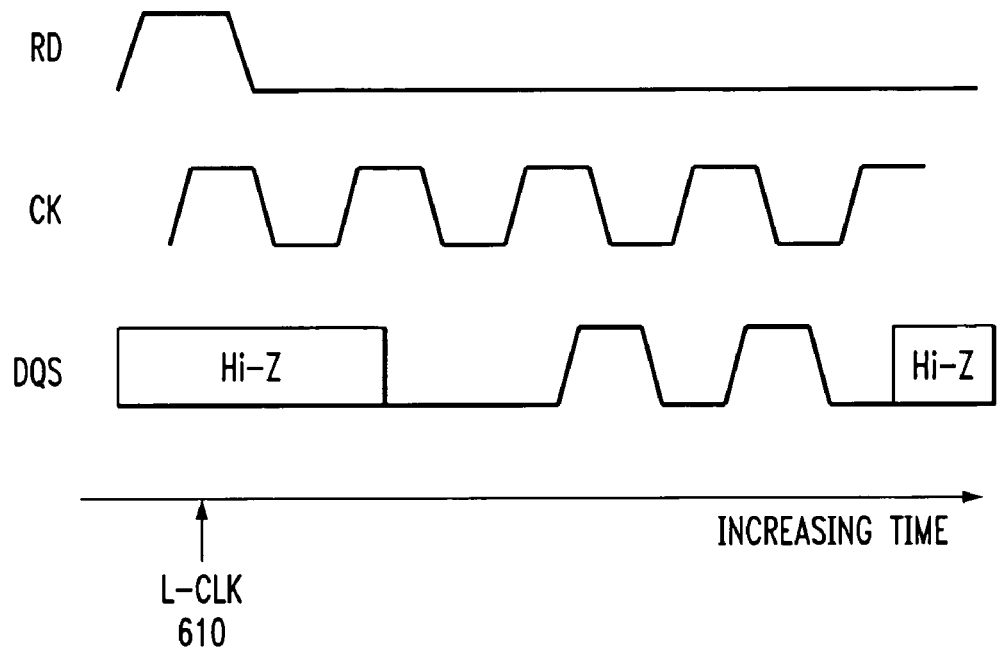
FIG. 6 illustrates an initial exemplary placement of the L-CLK signal during the calibration routine of the present invention.

FIG. 6 illustrates an initial exemplary placement of the L-CLK at a time position 610 during the calibration routine. The L-CLK is positioned well before the expected arrival of the DQS preamble after the round trip of the RD signal from the controller 110 to the memory 120 and then back again to the controller 110. The comparators CMPL, CMPM, CMPH should respond to Hi-Z inputs in a uniquely identifiable manner.

Figure 7:
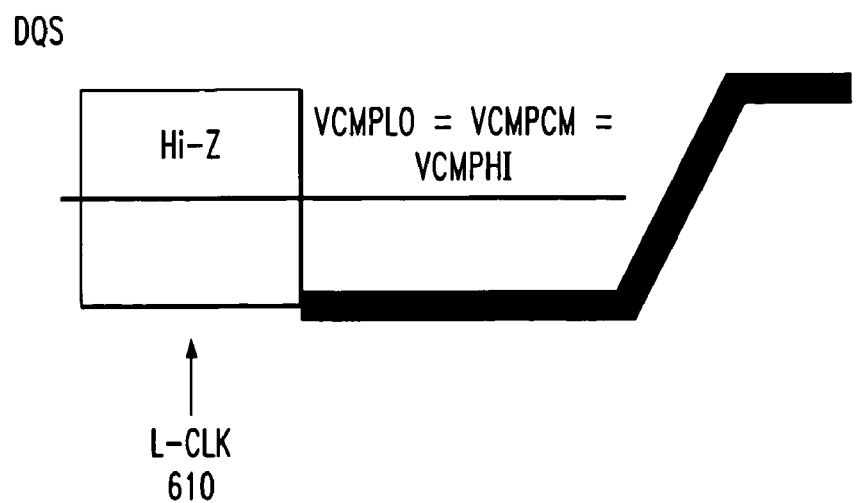

For instance, CMPL and CMPH can be designed to output a "0" when their respective "+" input experiences a Hi-Z value. CMPM can be designed to output a "1" when its respective "+" input experiences a Hi-Z value. The subsystem controller 530 will initially set the control signals VCMPLO, VCMPCM, and VCMPHI all to an approximate DQS mid-signal level as shown in FIG. 7. The L-CLK position 610 will cause the three flip-flops (FFL, FFM, and FFH) to latch (L-M-H)=(010) because all comparator "+" inputs (DQS) are in the Hi-Z state. This is an impossible result for any valid, real voltage input other than Hi-Z. As long as the controller 530 senses a (010) result it knows that the L-CLK signal is in the Hi-Z region.

Figure 8:
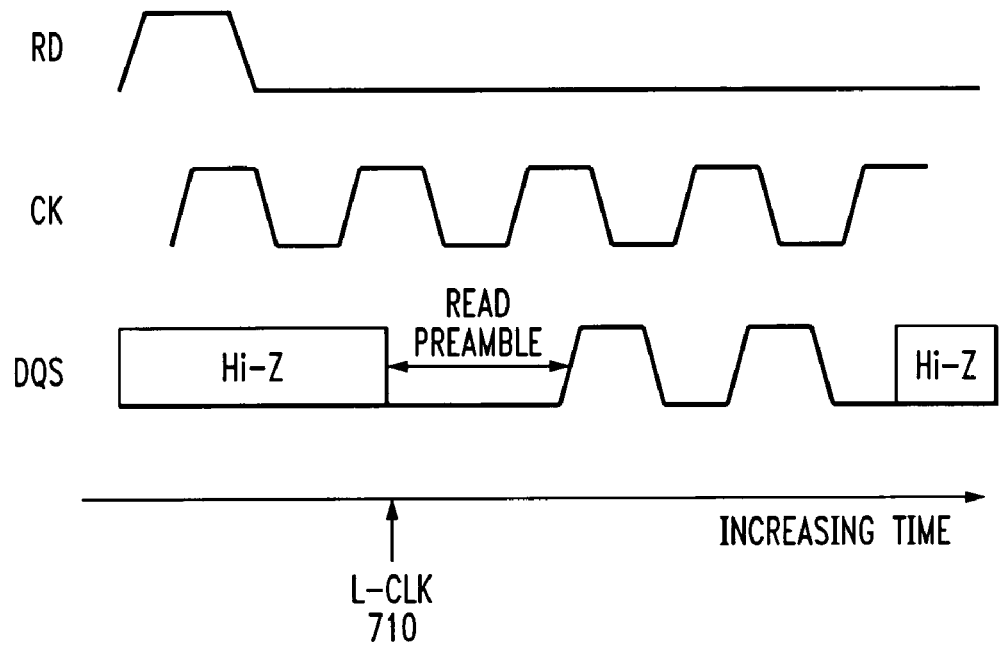
Figure 9:
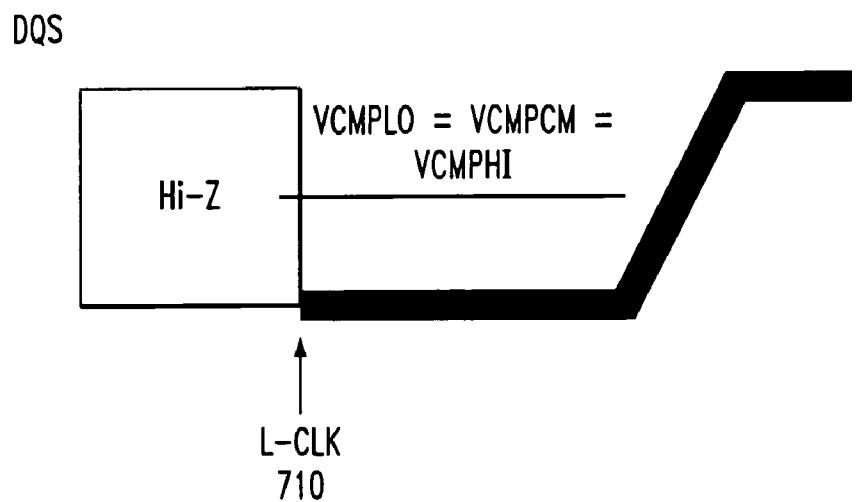

The subsystem controller 530 can now gradually move the L-CLK to later times, such as a time 710, until L-CLK emerges into the preamble (or another known and valid state), as shown in FIG. 8. For example, as illustrated in FIG. 9, if the comparators CMPL, CMPM, CMPH collectively cause the flip flops to latch (000), indicating that the measured DQS signal is below each of the three control signals VCMPLO, VCMPCM, VCMPHI that have been set to an approximate DQS mid-signal level, then the subsystem controller 530 can determine that L-CLK has emerged into the preamble.

Figure 10:
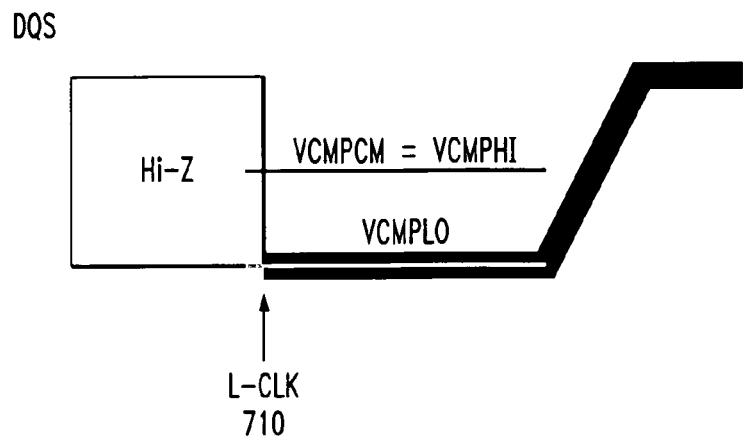
Figure 11:
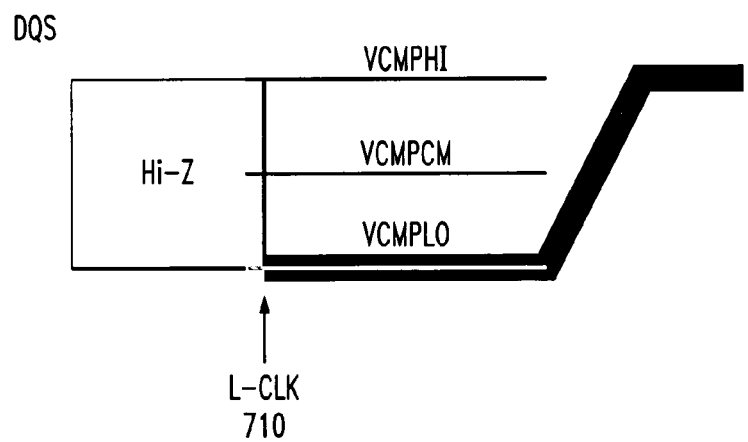

Once the subsystem controller 530 has encountered the preamble, the calibration routine proceeds to determine an approximation to the signal levels VCMPLO, VCMPCM, and VCMPHI in the preamble region. The VCMPLO control signal is adjusted until it no longer statistically indicates that its input is lower than its reference level. This is illustrated in FIG. 10. The VCMPHI control signal is then moved an amount higher than VCMPCM which equals the amount that VCMPCM is higher than VCMPLO. This is illustrated in FIG. 11. These values become the first approximation for the comparator reference voltages. The calibration routine will have the capability of refining these levels for greater accuracy.

Figure 12:
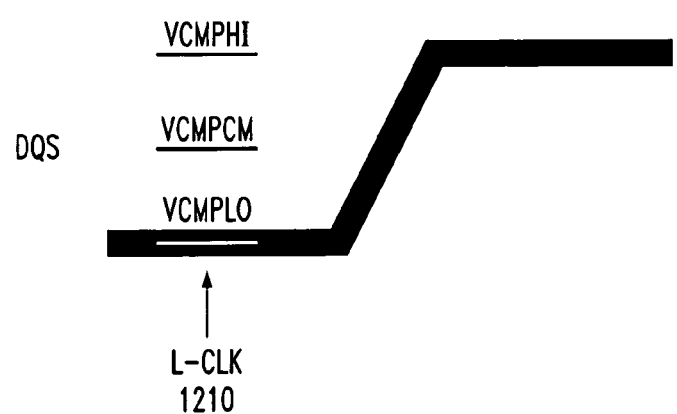
FIG. 12 illustrates the control inputs VCMPLO, VCMPCM, and VCMPHI of the three comparators CMPL, CMPM, CMPH in the preamble region, after determination of the appropriate signal levels.
Figure 13:
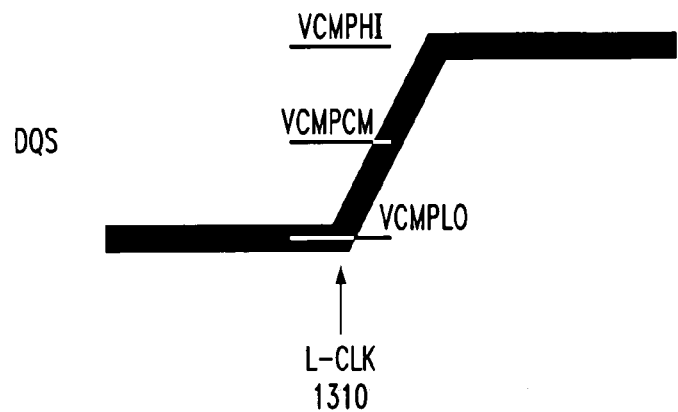
FIGS. 13 through 15 illustrate the L-CLK timing for identifying the beginning, middle and end of the first DQS rising edge, respectively.

FIG. 12 again illustrates the control inputs VCMPLO, VCMPCM, and VCMPHI of the three comparators CMPL, CMPM, CMPH in the preamble region as the controller 530 moves the L-CLK time. The subsystem controller 530 continues to move the L-CLK signal to later times, such as position 1310, until the situation in FIG. 13 is encountered. Generally, FIG. 13 illustrates the L-CLK timing at position 1310 for identifying the beginning of the first DQS rising edge.

Figure 14:
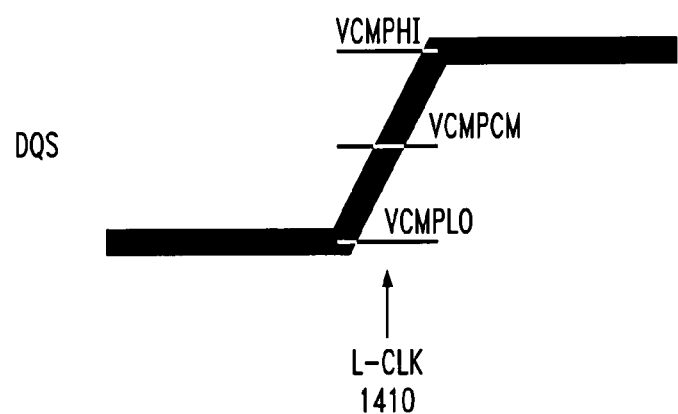
Figure 15:
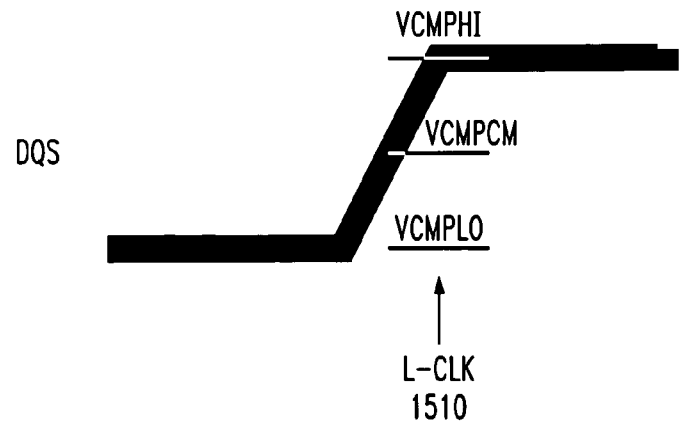

As the first DQS rising edge of the DQS signal is approached, the statistical response of the comparator CMPL will begin to change. The subsystem controller 530 can identify this condition as the beginning of the first rising DQS edge. Similarly, as the subsystem controller 530 varies the L-CLK signal to positions 1410 and 1510, respectively, as shown in FIGS. 14 and 15, the subsystem controller 530 can identify the middle (VCMPCM) and end (VCMPHI) of the first rising DQS edge, respectively. Thus, FIGS. 14 through 15 illustrate the L-CLK timing for identifying the beginning, middle and end of the first DQS rising edge, respectively.

Once the subsystem controller 530 has determined the time interval between the system clock edge that clocks the RD request and (a) the beginning of the preamble (FIG. 8) and (b) the middle of the first DQS rising edge (FIG. 14), the timing of the gating control signal (FIG. 5) can be established. This will allow the DQS signal into the delay line 520 after the Hi-Z state and before the first rising DQS edge. The delay line timing control (FIG. 5), which will have been determined by well-established techniques, will then enforce a ¼ system clock period delay on DQS to result in the timing shown if FIG. 3.

Improved DDR2 Controller without Delay Line

Figure 16:
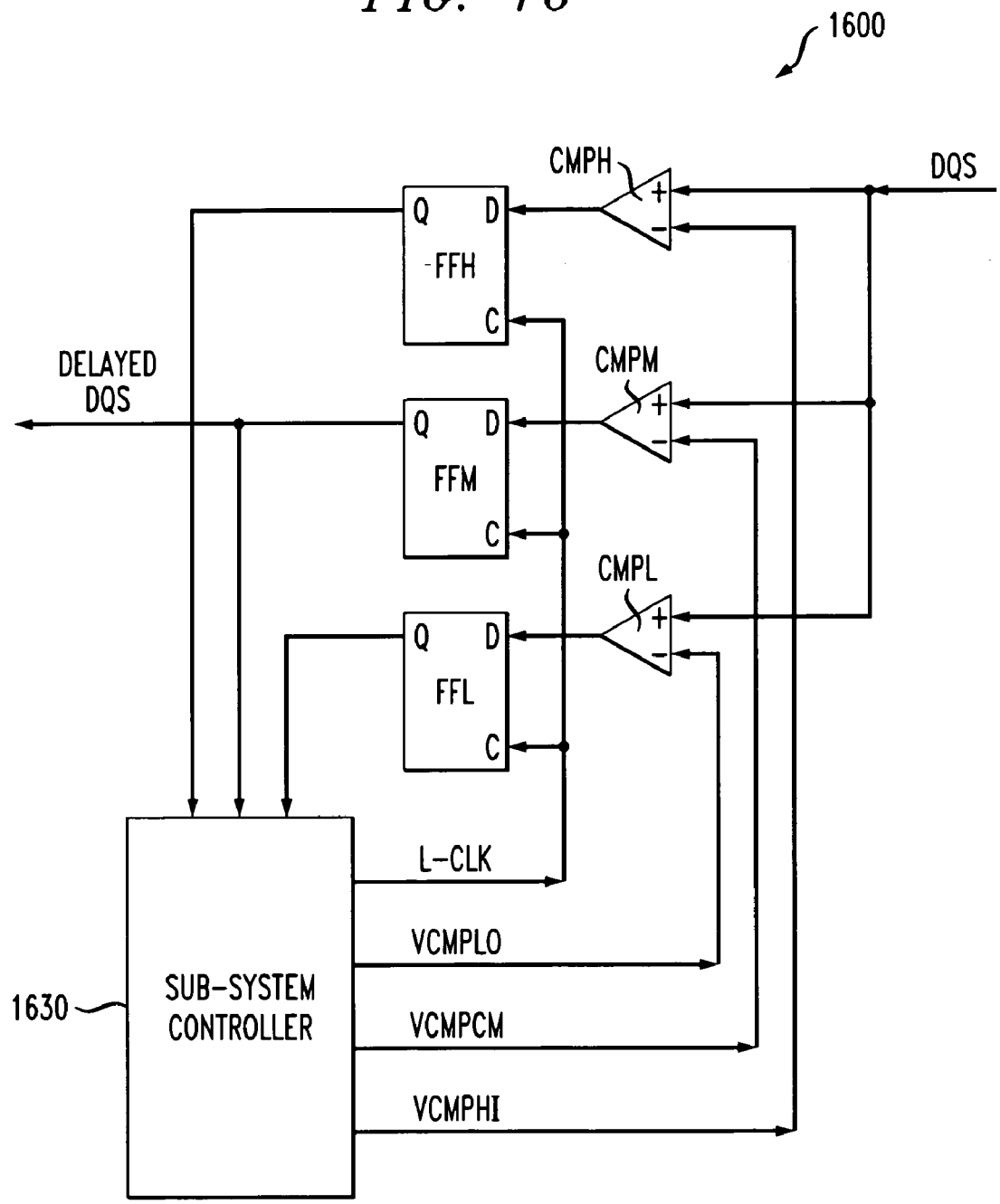
FIG. 16 is a schematic block diagram of an alternate DDR2 controller incorporating features of the present invention.
Figure 17:
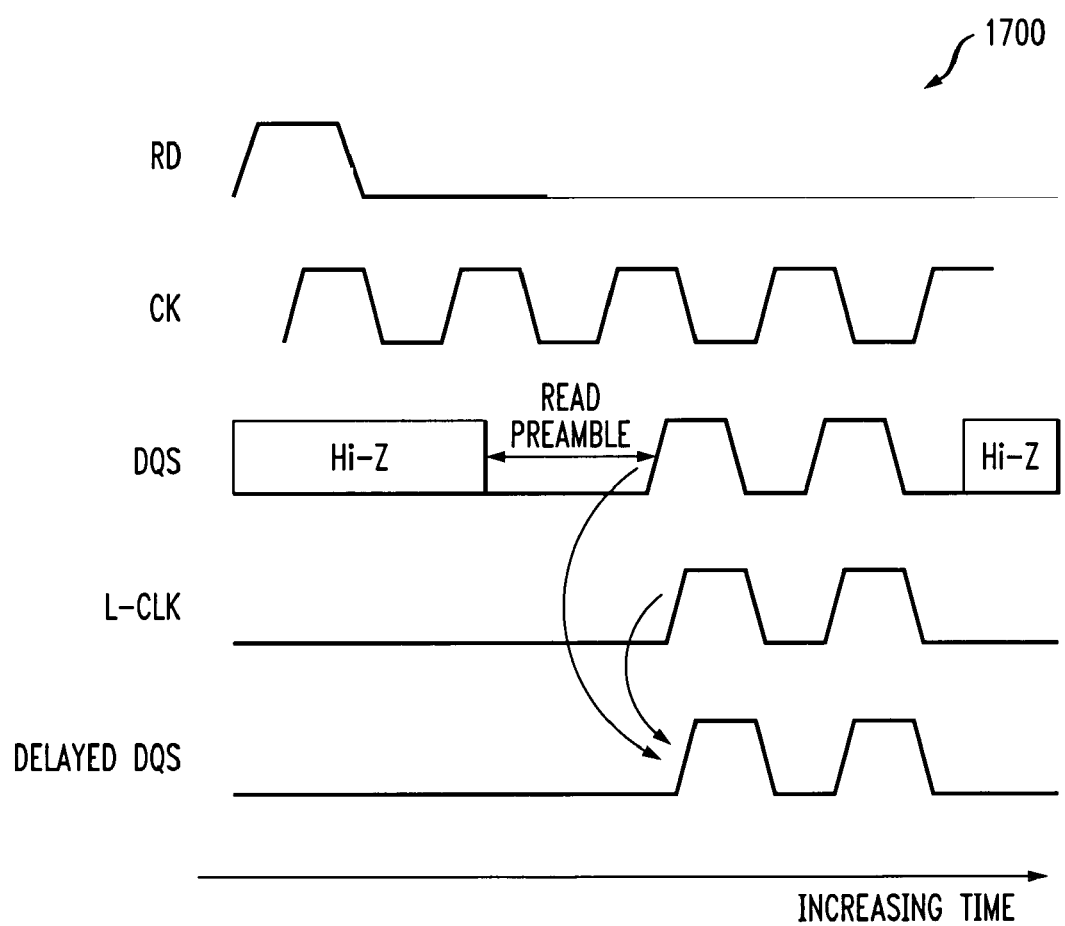
FIG. 17 illustrates the timing of the signals of FIG. 16.

FIG. 16 is a schematic block diagram of an alternate DDR2 controller 1600 incorporating features of the present invention. The DDR2 controller 1600 shown in FIG. 16 does not employ the delay line of FIG. 5. The techniques described above in conjunction with FIG. 5 are used to identify the time delays between the system clock edge that strobes the RD request and the beginning of the preamble and the first rising DQS edge. The middle flip flop FFM is designed to respond to both edges of L-CLK. The subsystem controller 1630 then issues an L-CLK signal with appropriate timing such that the Q output of the middle flip flop FFM can be used as the delayed DQS, as shown in FIG. 16. The timing of the signals 1700 is shown in FIG. 17. This timing now satisfies the requirements as shown in FIG. 3. Alternatively, the L-CLK signal itself can be adjusted in time so as to serve as the delayed DQS signal to strobe the DQ[0:n] data.

While exemplary embodiments of the present invention have been described with respect to digital logic blocks, such as subsystem controller 530, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for adaptive determination of a timing signal having a first edge with respect to an internal clock, wherein said timing signal includes a period in which said timing signal is undriven, followed by a period immediately before a first transition in which said timing signal is in a predefined state, said method comprising:
    evaluating said timing signal using one or more comparators;
    latching an output of said one or more comparators based on a clock signal;
    adjusting said clock signal until said one or more comparators indicate said timing signal is in said predefined state;
    further adjusting said clock signal until said one or more comparators indicate said first transition has been reached; and
    establishing a gating control signal based on a timing of said first transition.

2. The method of claim 1, wherein said timing signal is received from a memory in response to a read request.

3. The method of claim 1, wherein said one or more comparators compare said timing signal to one or more controllable voltage levels.

4. The method of claim 1, wherein said latching step is performed by one or more flip-flops.

5. The method of claim 1, wherein said period in which said timing signal is undriven is a high-impedance state.

6. The method of claim 1, wherein said timing signal is data strobe signal.

7. The method of claim 1, wherein said period when said signal has a predefined state is a preamble period.

8. The method of claim 1, wherein said period when said signal has a predefined state is a postamble period.

9. The method of claim 1, wherein said timing signal has a particular timing relationship established with other input signals.

10. The method of claim 1, wherein said establishing step is based on the time interval between a system clock edge that clocks a read request and (a) the beginning of the predefined state; and (b) approximately a middle of the first transition.

11. The method of claim 10, wherein said gating control signal allows said timing signal into a delay line after said period in which said timing signal is undriven and before said first transition.

12. A circuit for adaptive determination of a timing signal having a first edge with respect to an internal clock, wherein said timing signal includes a period in which said timing signal is undriven, followed by a period immediately before a first transition in which said timing signal is in a predefined state, comprising:
    one or more comparators for evaluating said timing signal using;
    one or more latches for latching an output of said one or more comparators based on a clock signal;
    means for adjusting said clock signal until said one or more comparators indicate said timing signal is in said predefined state; and for further adjusting said clock signal until said one or more comparators indicate said first transition has been reached; and
    means for establishing a gating control signal based on a timing of said first transition.

13. The circuit of claim 12, wherein said timing signal is received from a memory in response to a read request.

14. The circuit of claim 12, wherein said one or more comparators compare said timing signal to one or more controllable voltage levels.

15. The circuit of claim 12, wherein said period in which said timing signal is undriven is a high-impedance state.

16. The circuit of claim 12, wherein said timing signal is data strobe signal.

17. The circuit of claim 12, wherein said period when said signal has a predefined state is one or more of a preamble period and a postamble period.

18. An integrated circuit, comprising:
    a circuit for adaptive determination of a timing signal having a first edge with respect to an internal clock, wherein said timing signal includes a period in which said timing signal is undriven, followed by a period immediately before a first transition in which said timing signal is in a predefined state, comprising:
    one or more comparators for evaluating said timing signal using;
    one or more latches for latching an output of said one or more comparators based on a clock signal;
    means for adjusting said clock signal until said one or more comparators indicate said timing signal is in said predefined state; and for further adjusting said clock signal until said one or more comparators indicate said first transition has been reached; and
    means for establishing a gating control signal based on a timing of said first transition.

19. The integrated circuit of claim 18, wherein said timing signal is received from a memory in response to a read request.

20. The integrated circuit of claim 18, wherein said one or more comparators compare said timing signal to one or more controllable voltage levels.

21. A method for adaptive determination of a timing signal having a first edge with respect to an internal clock, wherein said timing signal includes a period in which said timing signal is undriven, followed by a period immediately before a first transition in which said timing signal is in a predefined state, said method comprising:

comparing said timing signal to each of one or more thresholds to generate a corresponding comparison;

selecting one of the comparisons based on a clock signal;

adjusting said clock signal until said one or more comparisons indicate said timing signal is in said predefined state;

further adjusting said clock signal until said one or more comparisons indicate said first transition has been reached; and establishing a gating control signal based on a timing of said first transition.

22. The method of claim 21, wherein said timing signal is received from a memory in response to a read request.

23. The method of claim 21, wherein said comparing step further comprises the step of comparing said timing signal to one or more controllable voltage levels.

24. The method of claim 21, wherein said period in which said timing signal is undriven is a high-impedance state.

25. The method of claim 21, wherein said period when said signal has a predefined state is one or more of a preamble period or a postamble period.

* * * * *